(12) United States Patent
Chuang et al.

(10) Patent No.: US 8,183,644 B1
(45) Date of Patent: May 22, 2012

(54) METAL GATE STRUCTURE OF A CMOS SEMICONDUCTOR DEVICE

(75) Inventors: Harry Hak-Lay Chuang, Hsinchu (TW); Bao-Ru Young, Zhubei (TW); Ming Zhu, Singapore (SG); Hui-Wen Lin, Taiping (TW); Lee-Wee Teo, Singapore (SG)

(73) Assignee: Taiwan Semiconductor Manufacturing Company, Ltd.

( * ) Notice: Subject to any disclaimer, the term of this patent is extended or adjusted under 35 U.S.C. 154(b) by 0 days.

(21) Appl. No.: 13/025,956

(22) Filed: Feb. 11, 2011

(51) Int. Cl.
*H01L 21/027* (2006.01)

(52) U.S. Cl. ........ 257/388; 257/369; 257/372; 257/392; 257/412; 257/E27.064; 257/E27.108

(58) Field of Classification Search .................. 257/369, 257/372, 388, 392, 412, E27.064, 108
See application file for complete search history.

(56) References Cited

U.S. PATENT DOCUMENTS

| | | | |
|---|---|---|---|
| 2008/0064159 A1* | 3/2008 | Ashida | 438/201 |
| 2008/0157215 A1* | 7/2008 | Miyashita | 257/374 |

* cited by examiner

*Primary Examiner* — Minchul Yang
(74) *Attorney, Agent, or Firm* — Lowe Hauptman Ham & Berner, LLP

(57) ABSTRACT

The invention relates to integrated circuit fabrication, and more particularly to a metal gate structure. An exemplary structure for a CMOS semiconductor device comprises a substrate comprising a P-active region, an N-active region, and an isolation region interposed between the P- and N-active regions; a P-metal gate electrode over the P-active region, that extends over the isolation region; and an N-metal gate electrode having a first width over the N-active region, that extends over the isolation region and has a contact section in the isolation region electrically contacting the P-metal gate electrode, wherein the contact section has a second width greater than the first width.

20 Claims, 10 Drawing Sheets

METAL GATE STRUCTURE OF A CMOS SEMICONDUCTOR DEVICE

FIELD OF THE INVENTION

The invention relates to integrated circuit fabrication, and more particularly to a metal gate structure.

BACKGROUND

As the technology nodes shrink, in some integrated circuit (IC) designs, there has been a desire to replace the typically polysilicon gate electrode with a metal gate electrode to improve device performance with the decreased feature sizes. One process of forming a metal gate structure is termed a "gate last" process in which the final gate structure is fabricated "last" which allows for a reduced number of subsequent processes, including high temperature processing, that must be performed after formation of the gate.

However, there are challenges to implement such features and processes in complementary metal-oxide-semiconductor (CMOS) fabrication. As the gate length and spacing between devices decrease, these problems are exacerbated. For example, it is difficult to achieve a stable threshold voltage for all CMOS semiconductor devices because atomic diffusion between adjacent gates causes shifts in the threshold voltage of CMOS semiconductor devices, thereby increasing the likelihood of device instability and/or device failure.

Accordingly, what is needed is a metal gate structure in which the threshold voltage is less sensitive to process variation.

SUMMARY

In one embodiment, a CMOS semiconductor device comprises a substrate comprising a P-active region, an N-active region, and an isolation region interposed between the P- and N-active regions; a P-metal gate electrode over the P-active region, that extends over the isolation region; and an N-metal gate electrode having a first width over the N-active region, that extends over the isolation region and has a contact section in the isolation region electrically contacting the P-metal gate electrode, wherein the contact section has a second width greater than the first width.

In another embodiment, a CMOS semiconductor device comprises a substrate comprising a P-active region, an N-active region, and an isolation region interposed between the P- and N-active regions; a P-metal gate electrode over the P-active region, that extends over the isolation region; and an N-metal gate electrode having a first width over the N-active region, that extends over the isolation region and has a contact section in the isolation region electrically contacting the P-metal gate electrode, wherein the contact section has a second width greater than the first width, wherein a ratio of the second width to the first width is from about 1.2 to 1.5.

In still another embodiment, a method for fabricating a CMOS semiconductor device comprises providing a substrate comprising a P-active region, an N-active region, and an isolation region interposed between the P- and N-active regions; forming a dielectric layer over the P-active region, N-active region, and isolation region; forming a first opening in the dielectric layer, that extends over an entire length of the P-active region and into the isolation region; partially filling the first opening with a P-work-function metal layer; forming a second opening having a first width over the N-active region in the dielectric layer, that extends over an entire length of the N-active region and into the isolation region and has a contact section connected to the first opening, wherein the contact section has a second width greater than the first width, partially filling the second opening with a N-work-function metal layer; depositing a signal metal layer in the second opening; and planarizing the signal metal layer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features in the drawings may be arbitrarily increased or reduced for clarity of discussion.

DETAILED DESCRIPTION

Figure 1:
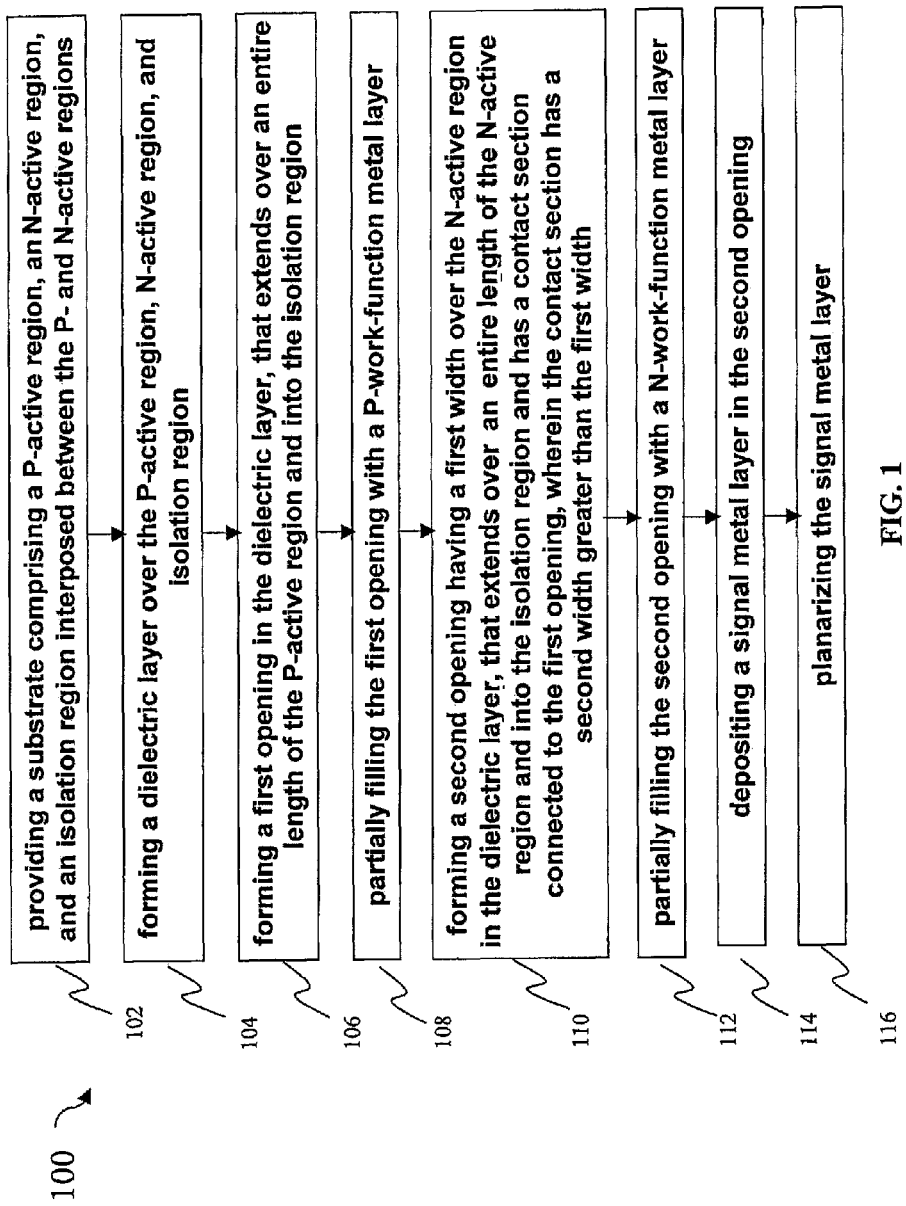
FIG. 1 is a flowchart illustrating a method for fabricating a CMOS semiconductor device comprising a metal gate structure according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. Further, the present disclosure may repeat reference numerals and/or letters in the various examples. This repetition is for the purpose of simplicity and clarity and does not in itself dictate a relationship between the various embodiments and/or configurations discussed. In addition, the present disclosure provides examples of a "gate last" metal gate process, however, one skilled in the art may recognize applicability to other processes and/or use of other materials.

Figure 2:
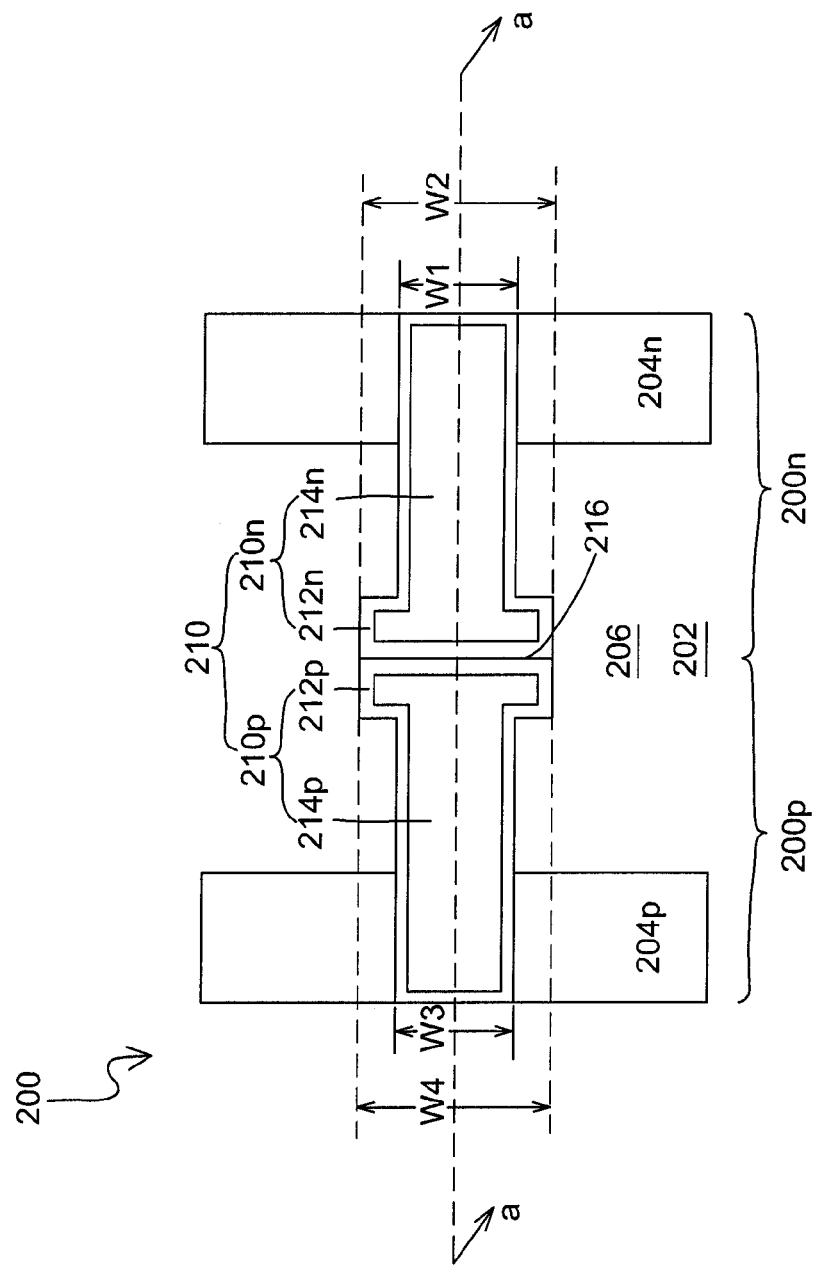
FIG. 2 shows a top view of a CMOS semiconductor device comprising a metal gate structure according to various aspects of the present disclosure.

FIG. 1 is a flowchart illustrating a method 100 for fabricating a complementary metal-oxide-semiconductor (CMOS) semiconductor device 200 comprising a metal gate structure 210 (shown in FIG. 2) according to various aspects of the present disclosure. FIG. 2 shows a top view of a CMOS semiconductor device 200 comprising a metal gate structure 210 according to various aspects of the present disclosure; and FIGS. 3A-3E show cross-section views taken along the line a-a of FIG. 2 at various stages of fabrication according to various aspects of the present disclosure. It is noted that part of the CMOS semiconductor device 200 may be fabricated with CMOS technology processing. Accordingly, it is understood that additional processes may be provided before, during, and after the method 100 of FIG. 1, and that some other processes may only be briefly described herein. Also, FIGS. 1 through 3E are simplified for a better understanding of the inventive concepts of the present disclosure. For example, although the figures illustrate a metal gate structure 210 for the CMOS semiconductor device 200, it is understood the CMOS semiconductor device 200 may be part of an integrated circuit (IC) that may comprise a number of other devices comprising resistors, capacitors, inductors, fuses, etc.

FIG. 2 shows a top view of a CMOS semiconductor device 200 comprising a metal gate structure 210 fabricated by a "gate last" process. A substrate 202 comprising a P-active region 204p, an N-active region 204n, and an isolation region 206 interposed between the P- and N-active regions 204p, 204n is provided. The CMOS semiconductor device 200 comprises a p-type metal oxide semiconductor field effect transistor (pMOSFET) 200p and an n-type metal oxide semiconductor field effect transistor (nMOSFET) 200n.

The pMOSFET 200p is formed from a P-metal gate electrode 210p over a channel region of the P-active region 204p. The P-metal gate electrode 210p may comprise, but is not limited to, a P-work-function metal layer 212p and a P-signal metal layer 214p over the P-work-function metal layer 212p. In one embodiment, the P-metal gate electrode 210p extends outside of the P-active region 204p and over the isolation region 206 to electrically contact to an N-metal gate electrode 210n of the nMOSFET 200n.

The nMOSFET 200n is formed from the N-metal gate electrode 210n over a channel region of the N-active region 204n. The N-metal gate electrode 210n may comprise, but is not limited to, an N-work-function metal layer 212n and an N-signal metal layer 214n over the N-work-function metal layer 212n. In one embodiment, the N-metal gate electrode 210n extends outside of the N-active region 204n over the isolation region 206 and has a contact section 216 in the isolation region 206 electrically contacting to the P-metal gate electrode 210p. In the present embodiment, the N-metal gate electrode 210n over the N-active region 204n has a first width $W_1$ in the range of about 10 to 30 nm, and the contact section 216 has a second width $W_2$ greater than the first width $W_1$. In one embodiment, a ratio of the second width $W_2$ to the first width $W_1$ is from about 1.2 to 1.5. In another embodiment, the P-metal gate electrode 210p over the P-active region 204p has a third width $W_3$ equal to the first width $W_1$. The contact section 216 of the P-metal gate electrode 210p contacting the N-metal gate electrode 210n has a fourth width $W_4$ that is equal to the second width $W_2$. The P-metal gate electrode 210p and N-metal gate electrode 210n are combined and hereinafter referred to as a metal gate structure 210.

Figure 3A:
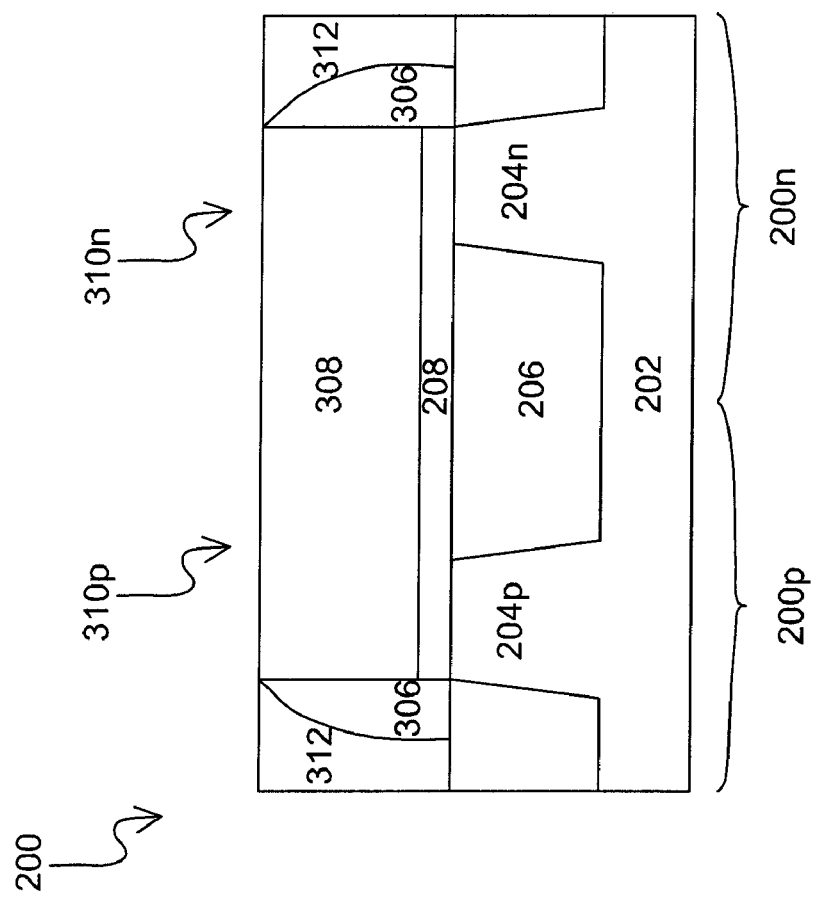
FIGS. 3A-3E show cross-section views taken along the line a-a of FIG. 2 at various stages of fabrication according to various aspects of the present disclosure.

Referring to FIG. 3A, the method 100 begins at step 102 wherein a substrate 202 is provided. The substrate 202 may comprise a silicon substrate. The substrate 202 may alternatively comprise silicon germanium, gallium arsenic, or other suitable semiconductor materials. The substrate 202 may further comprise other features such as various doped regions, a buried layer, and/or an epitaxial (epi) layer. Furthermore, the substrate 202 may be a semiconductor on insulator such as silicon on insulator (SOI). In other embodiments, the semiconductor substrate 202 may comprise a doped epi layer, a gradient semiconductor layer, and/or may further include a semiconductor layer overlying another semiconductor layer of a different type such as a silicon layer on a silicon germanium layer. In other examples, a compound semiconductor substrate may comprise a multilayer silicon structure or a silicon substrate may include a multilayer compound semiconductor structure.

In the present embodiments, the semiconductor substrate 202 may comprise a P-active region 204p for the pMOSFET 200p, an N-active region 204n for the nMOSFET 200n, and an isolation region 206 interposed between the P- and N-active regions 204p, 204n. The active regions 204p, 204n may include various doping configurations depending on design requirements. For example, the P-active region 204p is doped with n-type dopants, such as phosphorus or arsenic; the N-active region 204n is doped with p-type dopants, such as boron or $BF_2$.

Isolation region 206 may be formed on the substrate 202 to isolate the various active regions 204p, 204n from each other. The isolation region 206 may utilize isolation technology, such as local oxidation of silicon (LOCOS) or shallow trench isolation (STI), to define and electrically isolate the various active regions 204p, 204n. In the present embodiment, the isolation region 206 comprises an STI. The isolation regions 206 may comprise materials such as a silicon oxide, a silicon nitride, a silicon oxynitride, fluoride-doped silicate glass (FSG), a low-k dielectric material, and/or combinations thereof. The isolation region 206, and in the present embodiment, the STI, may be formed by any suitable process. As one example, the formation of the STI may include patterning the semiconductor substrate 202 by a conventional photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIG. 3A, a gate dielectric layer 208 may be formed over the substrate 202. In some embodiments, the gate dielectric layer 208 may comprise a silicon oxide, a silicon nitride, a silicon oxy-nitride, or a high-k dielectric. High-k dielectrics comprise certain metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 208 is a high-k dielectric layer comprising $HfO_x$ with a thickness in the range of about 10 to 30 angstroms. The gate dielectric layer 208 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 208 may further comprise an interfacial layer (not shown) to reduce damage between the gate dielectric layer 208 and the substrate 202. The interfacial layer may comprise a silicon oxide.

In a gate last process, a dummy gate electrode layer 308 is subsequently formed over the gate dielectric layer 208. In some embodiments, the dummy gate electrode layer 308 may comprise a single layer or multilayer structure. In the present embodiment, the dummy gate electrode layer 308 may comprise poly-silicon. Further, the dummy gate electrode layer 308 may be doped poly-silicon with uniform or gradient doping. The dummy gate electrode layer 308 may have a thickness in the range of about 30 nm to about 60 nm. The dummy electrode layer 308 may be formed using a low-pressure chemical vapor deposition (LPCVD) process. In one embodiment, the LPCVD process can be carried out in an LPCVD furnace at a temperature of about 580° C. to 650° C., and at a pressure of about 200 mTorr to 1 Torr, using silane (SiH$_4$) or dichlorosilane (SiH$_2$Cl$_2$) as the silicon source gas.

Then, the dummy gate electrode layer 308 and the gate dielectric layer 208 are patterned to produce the structure shown in FIG. 3A. A layer of photoresist (not shown) is formed over the dummy gate electrode layer 308 by a suitable process, such as spin-on coating, and patterned to form a patterned photoresist feature over the dummy gate electrode layer 308 by a proper lithography patterning method. A width of the patterned photoresist feature is in the range of about 15 to 45 nm. The patterned photoresist feature can then be transferred using a dry etching process to the underlying layers (i.e., the gate dielectric layer 208 and the dummy gate electrode layer 308) to form a P-dummy gate stack 310p and an N-dummy gate stack 310n. The photoresist layer may be stripped thereafter.

In another example, a hard mask layer (not shown) is formed over the dummy gate electrode layer 308; a patterned photoresist layer is formed on the hard mask layer; the pattern of the photoresist layer is transferred to the hard mask layer and then transferred to the dummy gate electrode layer 308 and the gate dielectric layer 208 to form the P-dummy gate stack 310p or N-dummy gate stack 310n. The hard mask layer comprises a silicon oxide. Alternatively, the hard mask layer may optionally comprise a silicon nitride, and/or a silicon oxynitride, and may be formed using a method such as CVD or PVD. The hard mask layer comprises a thickness in the range from about 100 to 800 angstroms.

It is noted that the CMOS semiconductor device 200 may undergo other "gate last" processes and other CMOS technology processing to form various features of the CMOS semiconductor device 200. As such, the various features are only briefly discussed herein. The various components of the CMOS semiconductor device 200 may be formed prior to formation of the P-metal gate electrode 210p and N-metal gate electrode 210n in a "gate last" process. The various components may comprise p-type and n-type lightly doped source/drain (LDD) regions (not shown) and p-type and n-type source/drain (S/D) regions (not shown) in the active regions 204p, 204n and on opposite sides of the P-dummy gate stack 310p and N-dummy gate stack 310n. The p-type LDD and S/D regions may be doped with B or In, and the n-type LDD and S/D regions may be doped with P or As.

The method 100 in FIG. 1 continues with step 104 in which the structure in FIG. 3A is produced by forming a dielectric layer over the P-active region 204p, N-active region 204n, and isolation region 206. The dielectric layer may comprise a single layer or multilayer structure. In one embodiment, the dielectric layer comprises gate spacers 306 on opposite sidewalls of the P-dummy gate stack 310p and N-dummy gate stack 310n. The gate spacers 306 may be formed of silicon oxide, silicon nitride or other suitable materials deposited by a CVD process. Then, an interlayer dielectric (ILD) layer 312 may be formed over the gate spacers 306, P-dummy gate stack 310p, N-dummy gate stack 310n and isolation region 206. The ILD layer 312 may include an oxide formed by a high-aspect-ratio process (HARP) and/or a high-density-plasma (HDP) deposition process. After the ILD layer 312 deposition, a chemical mechanical polishing (CMP) is performed on the ILD layer 312 to expose the P-dummy gate stack 310p and N-dummy gate stack 310n.

Figure 3B:
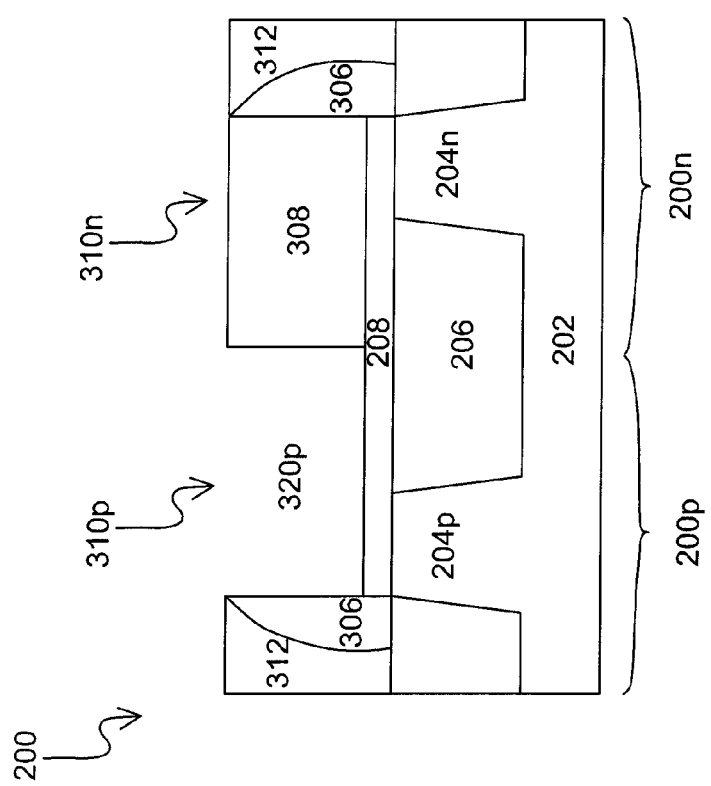

The method 100 in FIG. 1 continues with step 106 in which the structure in FIG. 3B is produced by forming a first opening 320p in the dielectric layer (i.e., between the gate spacers 306), that extends over an entire length of the P-active region 204p and into the isolation region 206. In the present embodiment, using the gate spacers 306 as hard masks, the dummy gate electrode layer 308 of the P-dummy gate stack 310p are removed to form the first opening 320p in the gate spacers 306, while the dummy gate electrode layer 308 of the N-dummy gate stack 310n is covered by a patterned photoresist layer (not shown). In one embodiment, the dummy gate electrode layer 308 of the P-dummy gate stack 310p may be removed using a dry etch process. In one embodiment, the dry etch process may be performed under a source power of about 650 to 800 W, a bias power of about 100 to 120 W, and a pressure of about 60 to 200 mTorr, using Cl$_2$, HBr and He as etching gases.

Figure 3C:
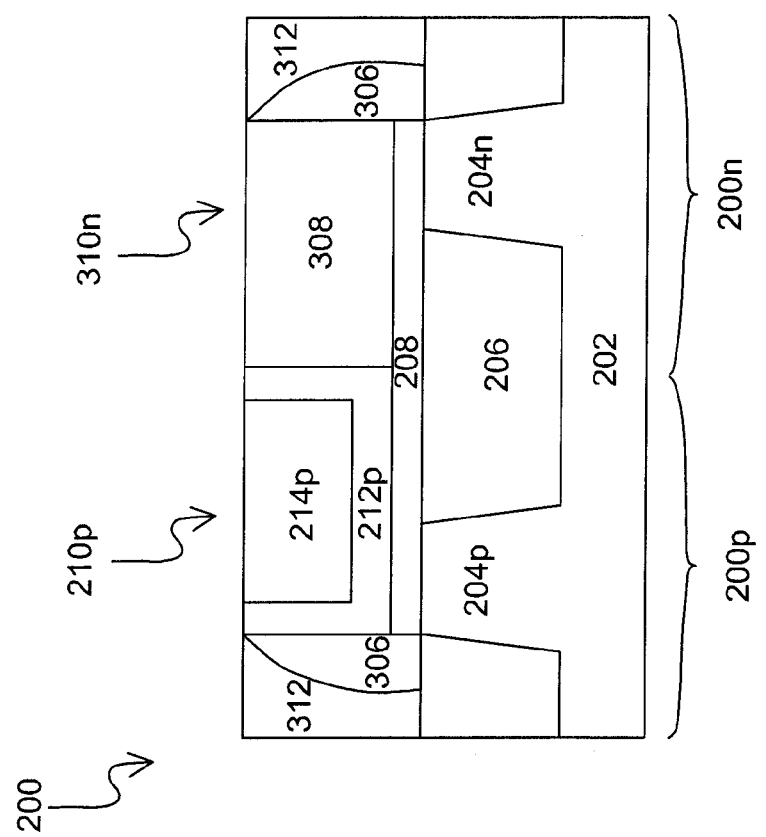

The method 100 in FIG. 1 continues with step 108 in which the structure in FIG. 3C is produced by partially filling the first opening 320p with a P-work-function metal layer 212p. The P-work-function metal layer 212p comprises a material selected from a group of TiN, WN, TaN and Ru. The P-work-function metal layer 212p may be formed by ALD, CVD or other suitable technique. The P-work-function metal layer 212p has a thickness ranging from about 30 to 80 angstroms.

In the present embodiment, the P-work-function metal layer 212p is first deposited over the gate dielectric layer 208, gate spacers 306, and ILD layer 312 to partially fill the first opening 320p. The next step is to deposit a P-signal metal layer 214p over the P-work-function metal layer 212p to substantially fill the first opening 320p. The P-signal metal layer 214p comprises a material selected from a group of Al, Cu and W. The P-signal metal layer 214 may be formed by CVD, PVD or other suitable technique.

Then, a CMP process is performed to remove a portion of the P-signal metal layer 214p and the P-work-function metal layer 212p outside of the first opening 320p. Accordingly, the CMP process may stop when reaching the ILD layer 312, and thus providing a substantially planar surface. Therefore, the P-metal gate electrode 210p may comprise, but not limited to, the P-work-function metal layer 212p and P-signal metal layer 214p.

Figure 3D:
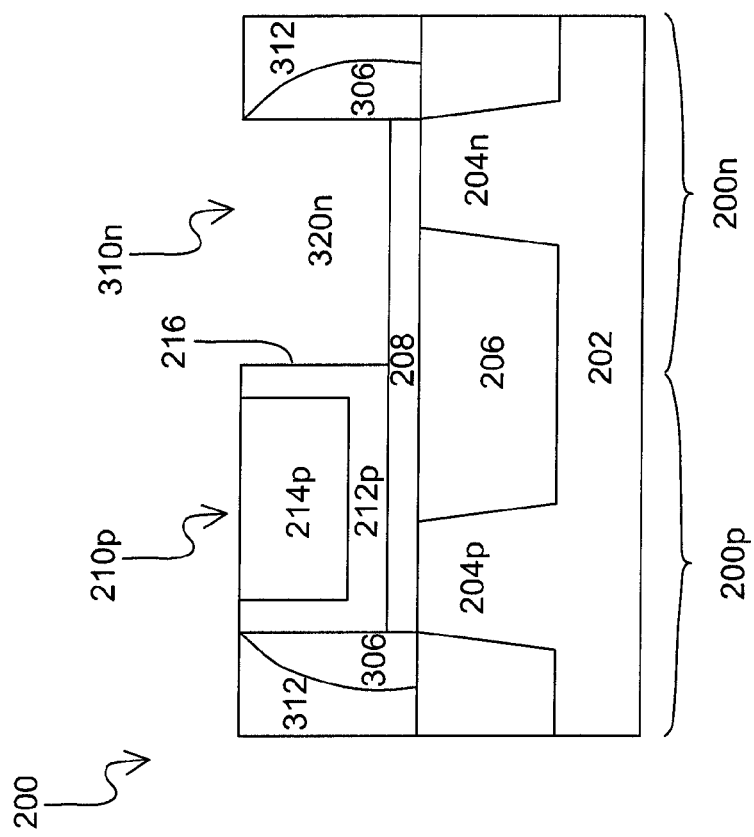

The method 100 in FIG. 1 continues with step 110 in which the structure in FIG. 3D is produced by forming a second opening 320n having the first width W$_1$ over the N-active region 204n in the dielectric layer (i.e., between the gate spacers 306), that extends over an entire length of the N-active region 204n and into the isolation region 206 and has a contact section 216 connected to the first opening 320p, wherein the contact section 216 has the second width W$_2$ greater than the first width W$_1$.

In the present embodiment, using the gate spacers 306 and P-metal gate electrode 210p as hard masks, the dummy gate electrode layer 308 of the N-dummy gate stack 310n is removed to form a second opening 320n in the gate spacers 306. In one embodiment, the dummy gate electrode layer 308 of the N-dummy gate stack 310n may be removed using a wet etch and/or a dry etch process. In one embodiment, the wet etch process includes exposure to a hydroxide solution containing ammonium hydroxide, diluted HF, deionized water, and/or other suitable etchant solutions. In another embodiment, the dry etch process may be performed under a source power of about 650 to 800 W, a bias power of about 100 to 120 W, and a pressure of about 60 to 200 mTorr, using Cl$_2$, HBr and He as etching gases.

Figure 3E:
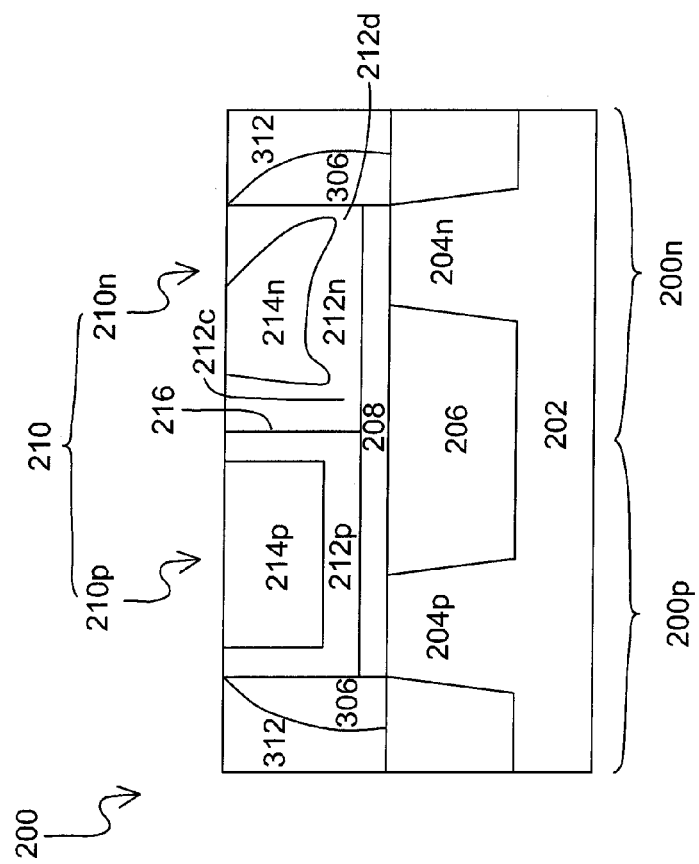

The method 100 in FIG. 1 continues with step 112 in which the structure in FIG. 3E is produced by partially filling the second opening 320n with an N-work-function metal layer 212n. The N-work-function metal layer 212n comprises a material selected from a group of Ti, Ag, Al, TiAl, TiAlN, TaC, TaCN, TaSiN, Mn, and Zr. The N-work-function metal layer 212n has a thickness ranging from about 30 to 80 angstroms. The N-work-function metal layer 212n may be formed by PVD or other suitable technique. Thus the N-work-function metal layer 212n and the P-work-function metal layer 212p electrically contact to each other over the isolation region 206.

It should be noted that the shadow effect of a PVD process is especially prone to form a metal overhang of the N-work-function metal layer 212n at the mouth of the second opening 320n, thereby the metal overhang tends to block a mouth of the high-aspect-ratio opening, for example, the mouth of the second opening 320n. Even if this metal overhang does not actually pinch off and close the second opening 320n, it will at least reduce a diameter of the mouth of the second opening 320n and consequently impede further metal material from entering into the second opening 320n. Thus the metal overhang will generate thinner portions of the N-work-function metal layer 212n in bottom corners of the second opening 320n. Thus, a concentration gradient between the N-signal metal layer 214n and the P-work-function metal layer 212p may drive the N-signal metal layer 214n through the thinner portions of the N-work-function metal layer 212n to the P-work-function metal layer 212p, thereby changing work function of the P-work-function metal layer 212p resulting in an unstable threshold voltage of the pMOSFET 200p.

In the present embodiment, the N-metal gate electrode 210n extends outside of the N-active region 204n over the isolation regions 206 and has a contact section 216 in the isolation region 206 electrically contacting the P-metal gate electrode 210p. Because the contact section 216 has a second width $W_2$ greater than the first width $W_1$ of the N-metal gate electrode 210n over the N-active region 204n, the N-work-function metal layer 212n adjacent to the contact section 216 in bottom corner 212c of the second opening 320n can generate a thicker thickness as compared with the N-work-function metal layer 212n adjacent to the N-active region 204n in bottom corner 212b of the second opening 320n due to low aspect-ratio. The thicker thickness of the N-work-function metal layer 212n in bottom corner 212c of the second opening 320n can be more effective to avoid atomic diffusion of the N-signal metal layer 214n to the P-work-function metal layer 212p. Accordingly, Applicant's method of fabricating a CMOS semiconductor device 200 may fabricate the P-metal gate electrode 210p maintaining its work function, thereby not changing the threshold voltage of the pMOSFET 200p and thus enhancing the device performance.

The method 100 in FIG. 1 continues with step 114 in which the structure in FIG. 3E is produced by depositing an N-signal metal layer 214n over the N-work-function metal layer 212n in the second openings 320n to substantially fill the second opening 320n. The N-signal metal layer 214n comprises a material selected from a group of Al, Cu and W. The N-signal metal layer 214n may be formed by CVD, PVD or other suitable technique.

The method 100 in FIG. 1 continues with step 116 in which the structure in FIG. 3E is produced by planarizing the N-signal metal layer 214n. A CMP is performed to remove the N-signal metal layer 214n and N-work-function metal layer 212n outsides of the second openings 320n. Accordingly, the CMP process may stop when reaching the ILD layer 312, and thus providing a substantially planar surface. Thus, the N-metal gate electrode 210n may comprise, but not limited to, the N-work-function metal layer 212n and N-signal metal layer 214n. The P-metal gate electrode 210p and N-metal gate electrode 210n are combined and referred to as the metal gate structure 210. In another embodiment, the step of forming the first opening 320p is after the step of forming the second opening 320n.

Figure 4:
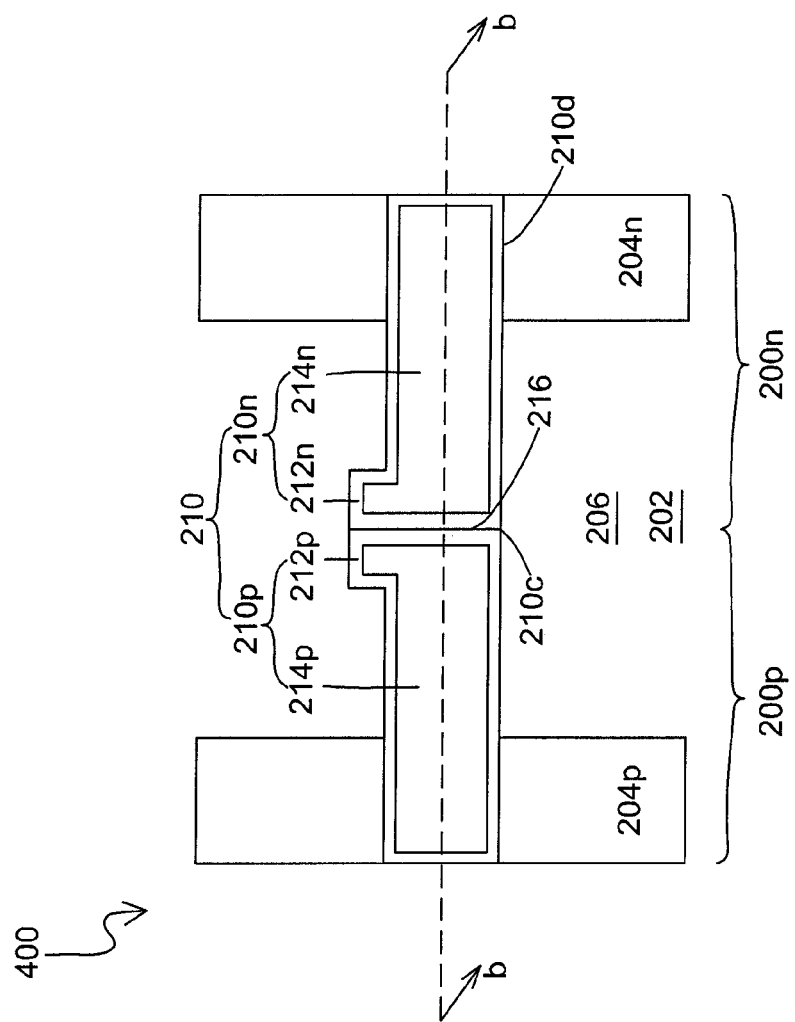
FIG. 4 shows a top view of a CMOS semiconductor device comprising a metal gate structure according to various aspects of the present disclosure.

Referring to FIG. 4, the diagram illustrates a top view of an alternate CMOS semiconductor device 400 comprising a metal gate structure 210 according to various aspects of the present disclosure fabricated using a method comprising the steps shown in FIGS. 3A-E. Similar features in FIGS. 2 and 4 are numbered the same for the sake of simplicity and clarity. In the present embodiment, the contact section 216 of the N-metal gate electrode 210n is asymmetrical with respect to a central line b-b of a portion of the N-metal gate electrode 210n over the N-active region 204n. In one embodiment, one edge 210c of the contact section 216 of the N-metal gate electrode 210n is aligned with one edge 210d of the N-metal gate electrode 210n over the N-active region 204n.

Figure 5:
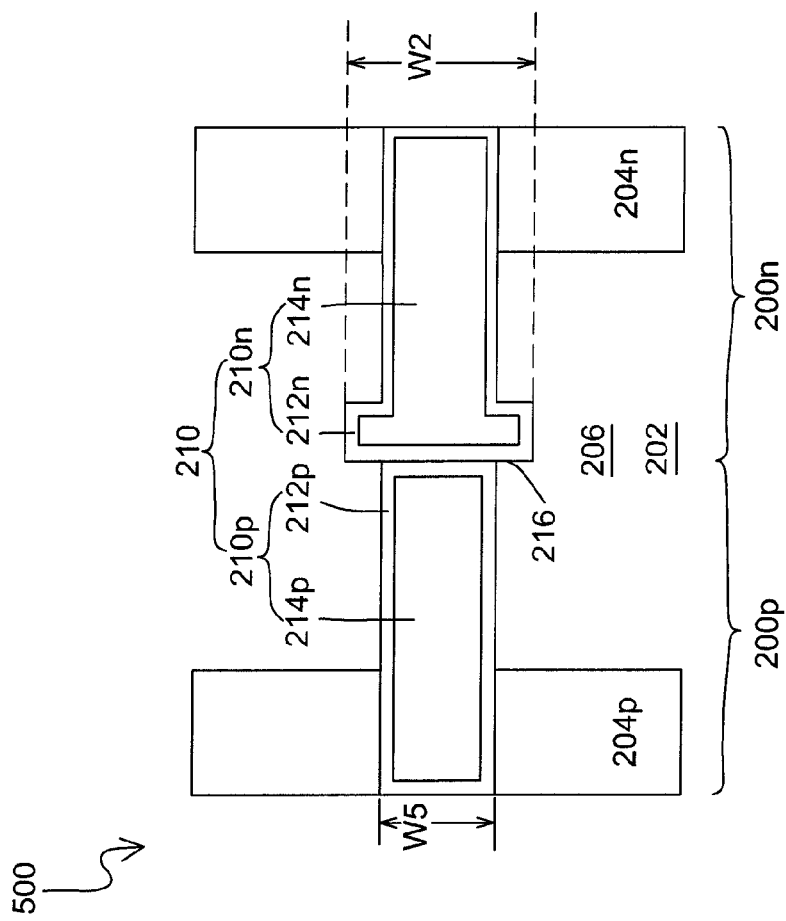
FIG. 5 shows a top view of a CMOS semiconductor device comprising a metal gate structure according to various aspects of the present disclosure.

Referring to FIG. 5, the diagram illustrates a top view of an alternate CMOS semiconductor device 500 comprising a metal gate structure 210 according to various aspects of the present disclosure fabricated using a method comprising the steps shown in FIGS. 3A-E. Similar features in FIGS. 2 and 5 are numbered the same for the sake of simplicity and clarity. In the present embodiment, a contact section 216 of the P-metal gate electrode 210p contacting the N-metal gate electrode 210n has a fifth width $W_5$ that is less than the second width $W_2$.

Figure 6:
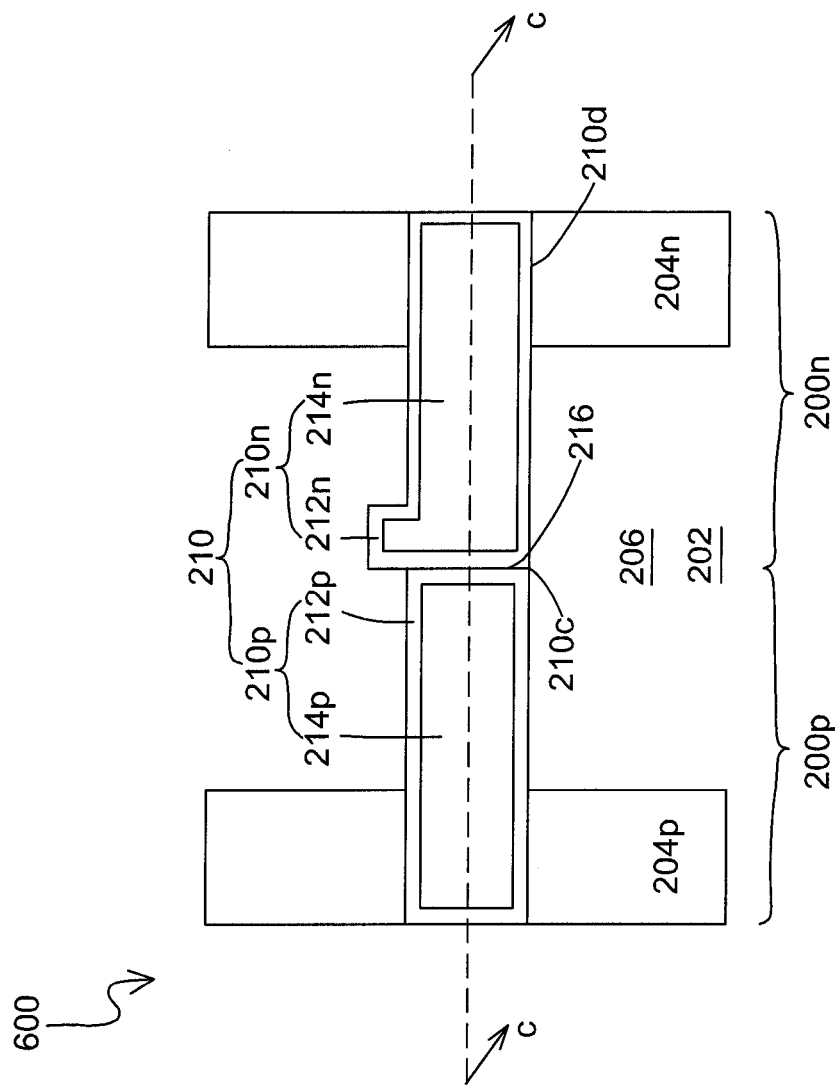
FIG. 6 shows a top view of a CMOS semiconductor device comprising a metal gate structure according to various aspects of the present disclosure.

Referring to FIG. 6, the diagram illustrates a top view of an alternate CMOS semiconductor device 600 comprising a metal gate structure 210 according to various aspects of the present disclosure fabricated using a method comprising the steps shown in FIGS. 3A-E. Similar features in FIGS. 2 and 6 are numbered the same for the sake of simplicity and clarity. In the present embodiment, the contact section 216 of the N-metal gate electrode 210n is asymmetrical with respect to a central line c-c of a portion of the N-metal gate electrode 210n over the N-active region 204n. In one embodiment, one edge 210c of the contact section 216 of the N-metal gate electrode 210n is aligned with one edge 210d of the N-metal gate electrode 210n over the N-active region 204n.

The thicker thickness of the N-work-function metal layer 212n in bottom corner 212c of the second opening 320n can be more effective to avoid atomic diffusion of the N-signal metal layer 214n to the P-work-function metal layer 212p. Accordingly, Applicant's method of fabricating CMOS semiconductor devices 200, 400, 500, 600 may fabricate the P-metal gate electrode 210p while maintaining its work function, thereby not changing the threshold voltage of the pMOSFET 200p and thus enhancing the device performance.

It is understood that the CMOS semiconductor devices 200, 400, 500, 600 may undergo further CMOS processes to form various features such as contacts/vias, interconnect metal layers, dielectric layers, passivation layers, etc. It has been observed that the modified metal gate structure 210 provides a stable work function to maintain a stable threshold voltage of the pMOSFET 200p, thereby enhancing the device performance.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A CMOS semiconductor device comprising:
   a substrate comprising a P-active region, an N-active region, and an isolation region interposed between the P- and N-active regions;

a P-metal gate electrode over the P-active region, that extends over the isolation region; and an N-metal gate electrode having a first width over the N-active region, that extends over the isolation region and has a contact section in the isolation region electrically contacting the P-metal gate electrode, wherein the contact section has a second width greater than the first width.

2. The semiconductor device of claim 1, wherein a ratio of the second width to the first width is from about 1.2 to 1.5.

3. The semiconductor device of claim 1, wherein the P-metal gate electrode over the P-active region has a third width equal to the first width.

4. The semiconductor device of claim 1, wherein the first width is in the range of about 10 to 30 nm.

5. The semiconductor device of claim 1, wherein a contact section of the P-metal gate electrode contacting the N-metal gate electrode has a fourth width that is less than the second width.

6. The semiconductor device of claim 1, wherein a contact section of the P-metal gate electrode contacting the N-metal gate electrode has a fourth width that is equal to the second width.

7. The semiconductor device of claim 1, wherein the contact section of the N-metal gate electrode is asymmetrical with respect to a central line of a portion of the N-metal gate electrode over the N-active region.

8. The semiconductor device of claim 7, wherein one edge of the contact section of the N-metal gate electrode is aligned with one edge of the N-metal gate electrode over the N-active region.

9. The semiconductor device of claim 1, wherein the P-metal gate electrode comprises a P-work-function metal layer.

10. The semiconductor device of claim 9, wherein a thickness of the P-work-function metal layer is in the range of about 30 to 80 angstroms.

11. The semiconductor device of claim 9, wherein the P-work-function metal layer comprises a material selected from a group of TiN, WN, TaN, and Ru.

12. The semiconductor device of claim 1, wherein the N-metal gate electrode comprises an N-work-function metal layer.

13. The semiconductor device of claim 12, wherein a thickness of the N-work-function metal layer is in the range of about 30 to 80 angstroms.

14. The semiconductor device of claim 12, wherein the N-work-function metal layer comprises a material selected from a group of Ti, Ag, Al, TiAl, TiAlN, TaC, TaCN, TaSiN, Mn, and Zr.

15. A method for fabricating a CMOS semiconductor device comprising:
providing a substrate comprising a P-active region, an N-active region, and an isolation region interposed between the P- and N-active regions;
forming a dielectric layer over the P-active region, N-active region, and isolation region;
forming a first opening in the dielectric layer, that extends over an entire length of the P-active region and into the isolation region;
partially filling the first opening with a P-work-function metal layer;
forming a second opening having a first width over the N-active region in the dielectric layer, that extends over an entire length of the N-active region and into the isolation region and has a contact section connected to the first opening, wherein the contact section has a second width greater than the first width,
partially filling the second opening with an N-work-function metal layer;
depositing a signal metal layer in the second opening; and
planarizing the signal metal layer.

16. The method of claim 15, wherein the step of forming the first opening is after the step of forming the second opening.

17. The method of claim 15, wherein a ratio of the second width to the first width is from about 1.2 to 1.5.

18. The method of claim 15, wherein the step of partially filling the first opening is performed using an atomic layer deposition process.

19. The method of claim 15, wherein the step of partially filling the first opening is performed using a physical vapor deposition process.

20. The method of claim 15, wherein the step of depositing a signal metal layer in the first and second openings is performed using a physical vapor deposition process.

* * * * *